United States Patent
Nakai et al.

(10) Patent No.: US 11,329,676 B2
(45) Date of Patent: May 10, 2022

(54) RADIO FREQUENCY MODULE AND COMMUNICATION DEVICE

(71) Applicant: Murata Manufacturing Co., Ltd., Nagaokakyo (JP)

(72) Inventors: Kazuhito Nakai, Nagaokakyo (JP); Satoshi Goto, Nagaokakyo (JP); Hidetaka Takahashi, Nagaokakyo (JP); Daerok Oh, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 17/195,684

(22) Filed: Mar. 9, 2021

(65) Prior Publication Data

US 2021/0288683 A1    Sep. 16, 2021

(30) Foreign Application Priority Data

Mar. 13, 2020    (JP) .............................. JP2020-044191

(51) Int. Cl.
  *H04B 1/04*    (2006.01)
  *H04B 1/03*    (2006.01)
  *H04B 1/58*    (2006.01)

(52) U.S. Cl.
  CPC ............. *H04B 1/0483* (2013.01); *H04B 1/03* (2013.01); *H04B 1/581* (2013.01); *H04B 2001/0408* (2013.01)

(58) Field of Classification Search
  CPC combination set(s) only.
  See application file for complete search history.

(56) References Cited

U.S. PATENT DOCUMENTS

| | | | | |
|---|---|---|---|---|
| 2006/0092079 | A1* | 5/2006 | de Rochemont | H01Q 15/006 343/700 MS |
| 2015/0214994 | A1* | 7/2015 | Yeh | H03F 3/211 455/78 |
| 2016/0261235 | A1* | 9/2016 | Ortiz | H03F 1/0205 |
| 2017/0301654 | A1* | 10/2017 | Frenette | H01L 25/50 |
| 2017/0338781 | A1* | 11/2017 | Lyalin | H03F 3/1935 |
| 2018/0261566 | A1* | 9/2018 | Babcock | H01L 23/66 |
| 2018/0286840 | A1* | 10/2018 | Nair | H01L 24/20 |
| 2020/0099348 | A1* | 3/2020 | Gebeyehu | H03F 1/565 |

FOREIGN PATENT DOCUMENTS

JP    2010-118916 A    5/2010

* cited by examiner

*Primary Examiner* — Junpeng Chen
(74) *Attorney, Agent, or Firm* — Xsensus LLP

(57) ABSTRACT

A radio frequency module includes: a module board that includes a first principal surface and a second principal surface on opposite sides of the module board; a power amplifier; and a first circuit component. The power amplifier includes: a first amplifying element; a second amplifying element; and an output transformer that includes a primary coil and a secondary coil. An end of the primary coil is connected to an output terminal of the first amplifying element, another end of the primary coil is connected to an output terminal of the second amplifying element, an end of the secondary coil is connected to an output terminal of the power amplifier, the first amplifying element and the second amplifying element are disposed on the first principal surface, and the first circuit component is disposed on the second principal surface.

19 Claims, 11 Drawing Sheets

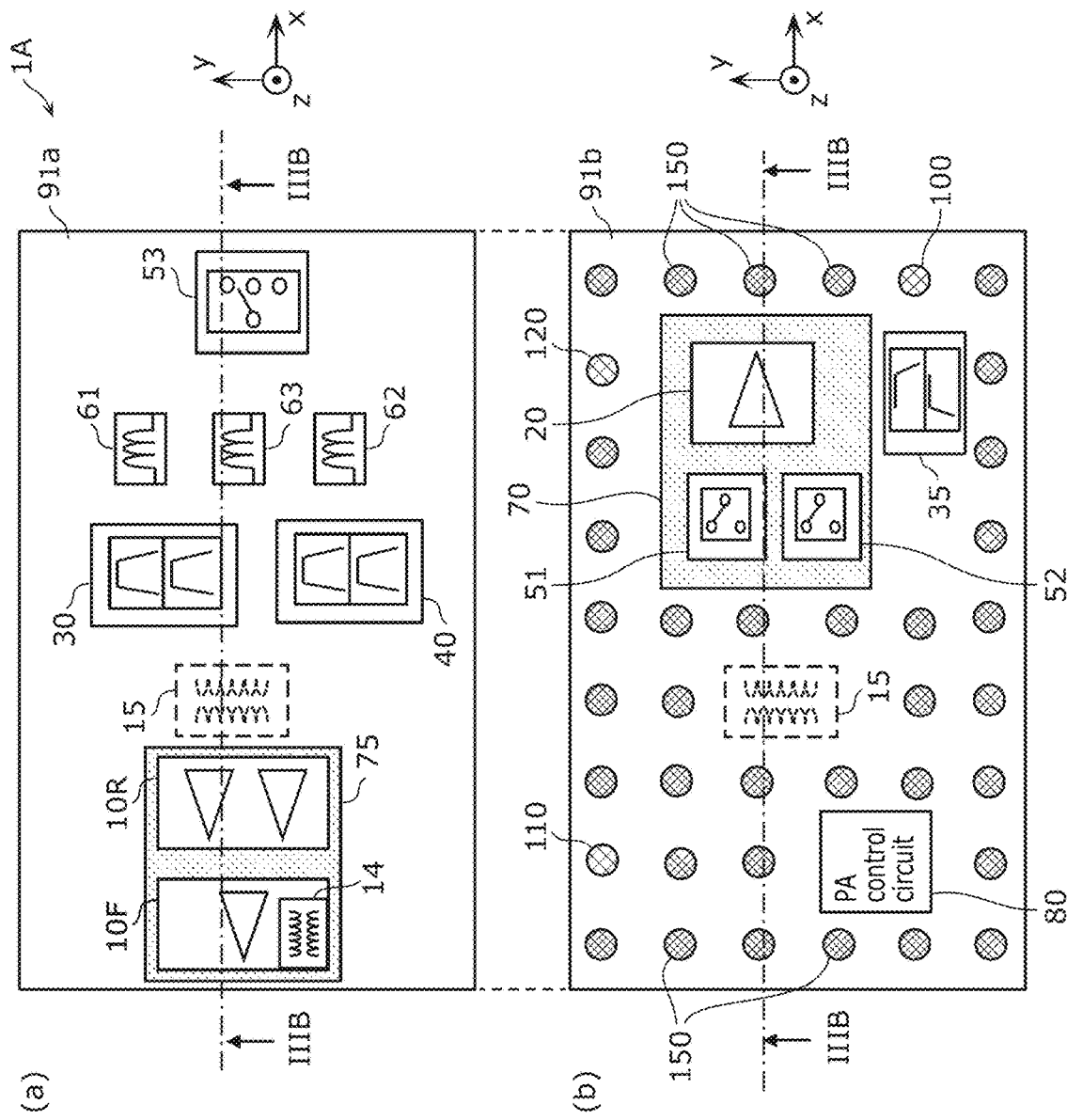

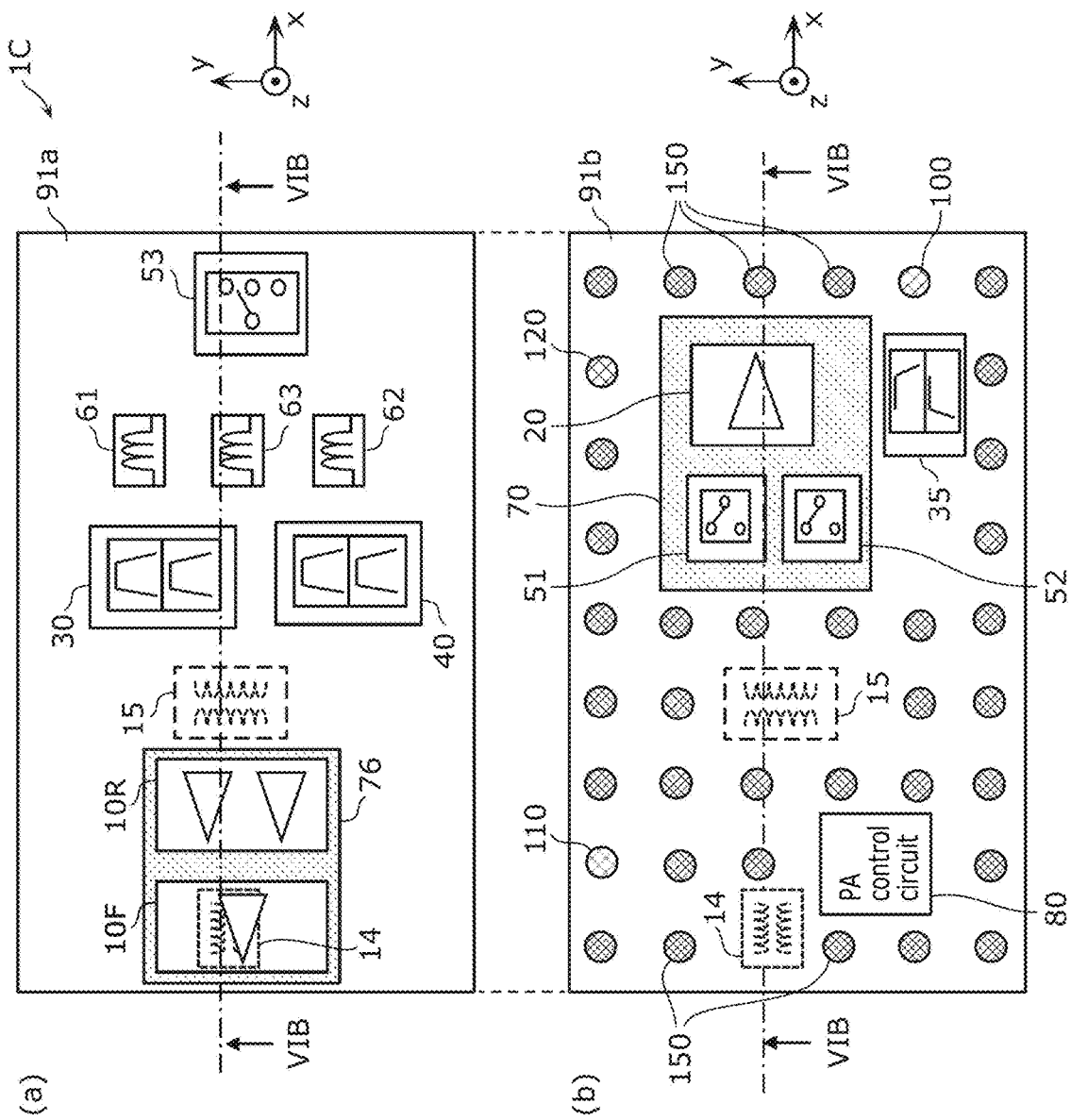

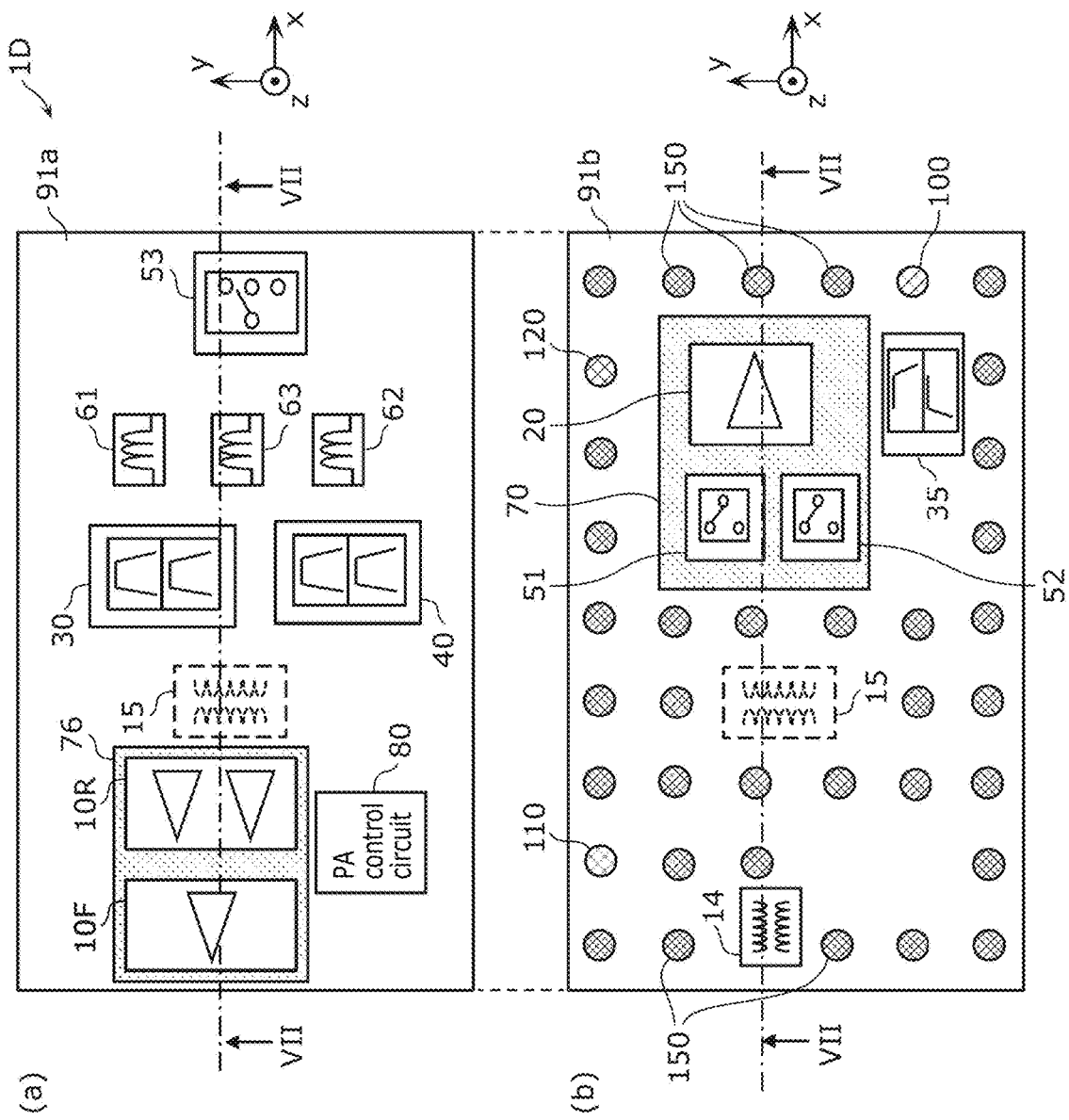

RADIO FREQUENCY MODULE AND COMMUNICATION DEVICE

CROSS-REFERENCE TO RELATED APPLICATION

The present application is based on and claims priority to Japanese Patent Application No. 2020-044191 filed on Mar. 13, 2020. The entire disclosure of the above-identified application, including the specification, drawings and claims is incorporated herein by reference in its entirety.

TECHNICAL FIELD

The present disclosure relates to a radio frequency module and a communication device.

BACKGROUND

A power amplifier that amplifies radio frequency transmission signals is provided in a mobile communication apparatus such as a mobile phone.

Japanese Unexamined Patent Application Publication No. 2010-118916 discloses a difference amplifying type power amplifier that includes a first transistor to which a non-inverted input signal is input, a second transistor to which an inverted input signal is input, and a transformer disposed on the output terminal side of the first transistor and the second transistor. The transformer includes two magnetically coupled primary coils and one secondary coil. The two primary coils are connected in parallel, and are each magnetically coupled with the secondary coil, so that the input impedance of the primary coils can be decreased without decreasing the Q factor. Accordingly, power gain can be improved.

SUMMARY

Technical Problems

However, as recognized by the present inventors, if the difference amplifying type power amplifier disclosed in Japanese Unexamined Patent Application Publication No. 2010-118916 is achieved using a single radio frequency module, many circuit elements are included in the power amplifier, which results in an increase in the size of the radio frequency module.

The present disclosure has been conceived to solve the above-identified and other problems, and provides a small radio frequency module that includes a difference amplifying type power amplifier, and a communication device that includes the radio frequency module.

Solutions

In order to provide such a radio frequency module, a radio frequency module according to an aspect of the present disclosure includes: a module board that includes a first principal surface and a second principal surface on opposite sides of the module board; a power amplifier configured to amplify a transmission signal; and a first circuit component. The power amplifier includes: a first amplifying element; a second amplifying element; a first transformer that includes a first coil and a second coil; and a second transformer that includes a third coil and a fourth coil. An end of the second coil is connected to an input terminal of the first amplifying element. Another end of the second coil is connected to an input terminal of the second amplifying element. An end of the third coil is connected to an output terminal of the first amplifying element. Another end of the third coil is connected to an output terminal of the second amplifying element. An end of the fourth coil is connected to an output terminal of the power amplifier. The first amplifying element and the second amplifying element are disposed on the first principal surface, and the first circuit component is disposed on the second principal surface.

Advantageous Effects

According to the present disclosure, a small radio frequency module that includes a difference amplifying type power amplifier, and a communication device are provided.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 3A is a schematic diagram illustrating a planar configuration of a radio frequency module according to Example 1.

FIG. 6A is a schematic diagram illustrating a planar configuration of a radio frequency module according to Example 2.

FIG. 7A is a schematic diagram illustrating a planar configuration of a radio frequency module according to Example 3.

DESCRIPTION OF EMBODIMENTS

Figure 1:
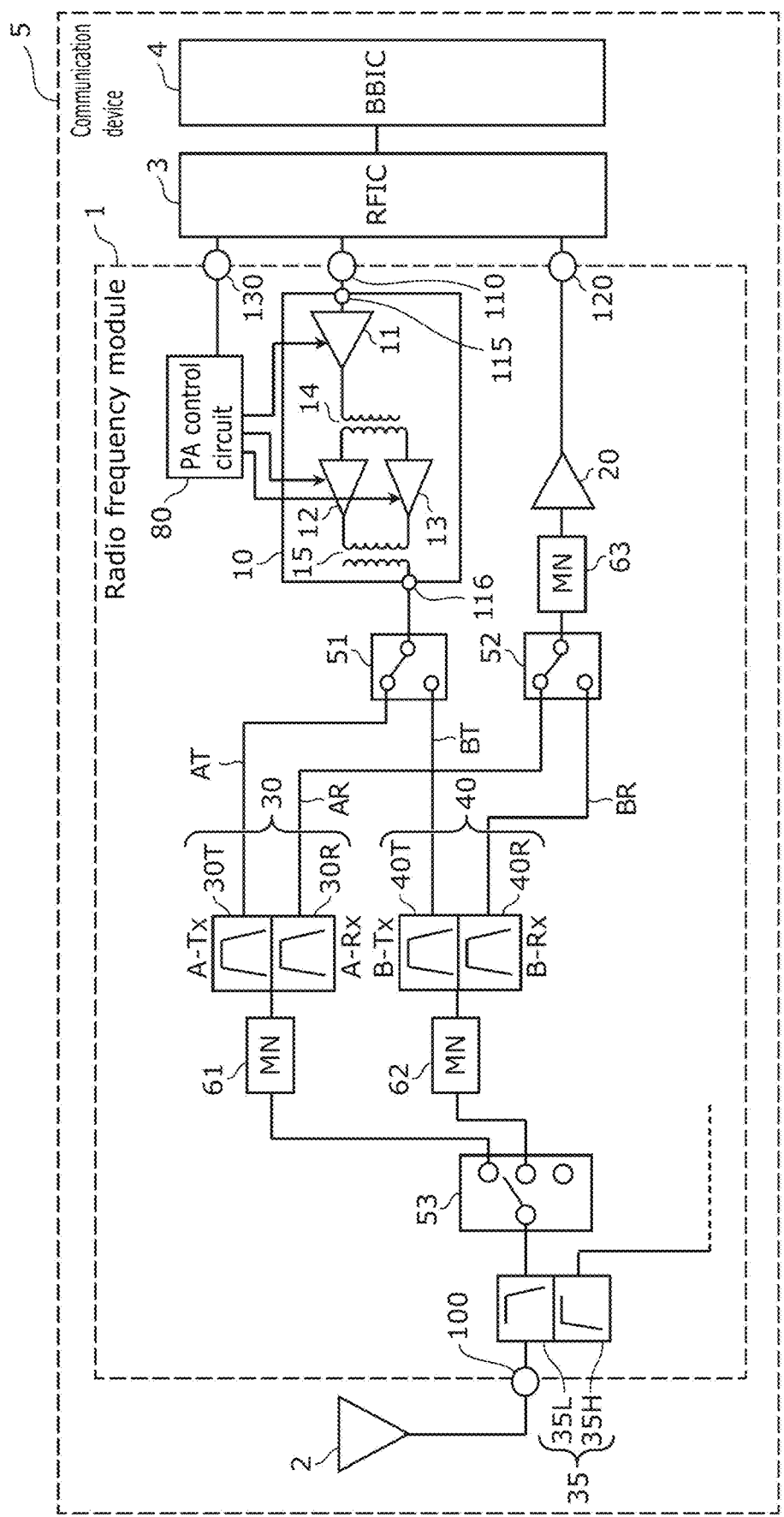
FIG. 1 illustrates a circuit configuration of a radio frequency module and a communication device according to an embodiment.

The following describes in detail embodiments of the present disclosure. Note that the embodiments described below each show a general or specific example. The numerical values, shapes, materials, elements, and the arrangement and connection of the elements, for instance, described in the following embodiments are examples, and thus are not intended to limit the present disclosure. Among the elements in the following examples and variations, elements not recited in any of the independent claims are described as arbitrary elements. In addition, the sizes of elements and the ratios of the sizes illustrated in the drawings are not necessarily accurate. Throughout the drawings, the same numeral is given to substantially the same element, and redundant description may be omitted or simplified.

In the following, a term that indicates a relation between elements such as "parallel" or "perpendicular", a term that indicates the shape of an element such as "rectangular", and a numerical range do not necessarily have only strict meanings, and also cover substantially equivalent ranges that include a difference of about several percent, for example.

In the following, regarding A, B, and C mounted on a board, "C is disposed between A and B in a plan view of a board (or a principal surface of a board)" means at least one of line segments that connect arbitrary points in A and B passes through a region of C in a plan view of a board. A plan view of a board means that a board and a circuit element mounted on the board are viewed, being orthogonally projected onto a plane parallel to a principal surface of the board. In addition, "on" in expressions such as mounted on, disposed on, provided on, and formed on, for example, does not necessarily indicate direct contact.

In the following, a "transmission path" means a transfer route that includes, for instance, a line through which a radio frequency transmission signal propagates, an electrode directly connected to the line, and a terminal directly connected to the line or the electrode. Further, a "reception path" means a transfer route that includes, for instance, a line through which a radio frequency reception signal propagates, an electrode directly connected to the line, and a terminal directly connected to the line or the electrode. In addition, a "transmission and reception path" means a transfer route that includes, for instance, a line through which a radio frequency transmission signal and a radio frequency reception signal propagate, an electrode directly connected to the line, and a terminal directly connected to the line or the electrode.

In the following, "A and B are connected" applies not only when A and B are physically connected, but also when A and B are electrically connected.

Embodiment

[1. Circuit Configuration of Radio Frequency Module 1 and Communication Device 5]

FIG. 1 illustrates a circuit configuration of radio frequency module 1 and communication device 5 according to an embodiment. As illustrated in FIG. 1, communication device 5 includes radio frequency module 1, antenna 2, radio frequency (RF) signal processing circuit (RF integrated circuit (RFIC)) 3, and baseband signal processing circuit (BB integrated circuit (BBIC)) 4.

RFIC 3 is an RF signal processing circuit that processes radio frequency signals transmitted and received by antenna 2. Specifically, RFIC 3 processes a reception signal input through a reception path of radio frequency module 1 by down-conversion, for instance, and outputs a reception signal generated by being processed to BBIC 4. RFIC 3 processes a transmission signal input from BBIC 4 by up-conversion, for instance, and outputs a transmission signal generated by being processed to a transmission path of radio frequency module 1.

BBIC 4 is a circuit that processes signals using an intermediate frequency band lower than the frequency range of a radio frequency signal transferred in radio frequency module 1. A signal processed by BBIC 4 is used, for example, as an image signal for image display or as an audio signal for talk through a loudspeaker.

RFIC 3 also functions as a controller that controls connection made by switches 51, 52, and 53 included in radio frequency module 1, based on a communication band (a frequency band) to be used. Specifically, RFIC 3 changes connection made by switches 51 to 53 included in radio frequency module 1 according to control signals (not illustrated). Specifically, RFIC 3 outputs digital control signals for controlling switches 51 to 53 to power amplifier (PA) control circuit 80. PA control circuit 80 of radio frequency module 1 controls connection and disconnection of switches 51 to 53 by outputting digital control signals to switches 51 to 53 according to the digital control signals input from RFIC 3.

RFIC 3 also functions as a controller that controls the gain of power amplifier 10 included in radio frequency module 1 and power supply voltage Vcc and bias voltage Vbias that are supplied to power amplifier 10. Specifically, RFIC 3 outputs digital control signals to control signal terminal 130 of radio frequency module 1. PA control circuit 80 of radio frequency module 1 adjusts the gain of power amplifier 10 by outputting a control signal, power supply voltage Vcc, or bias voltage Vbias to power amplifier 10 according to a digital control signal input through control signal terminal 130. Note that a control signal terminal that receives, from RFIC 3, a digital control signal for controlling the gain of power amplifier 10 and a control signal terminal that receives, from RFIC 3, a digital control signal for controlling power supply voltage Vcc and bias voltage Vbias that are supplied to power amplifier 10 may be different terminals. The controller may be disposed outside of RFIC 3, and may be disposed in BBIC 4, for example.

Antenna 2 is connected to antenna connection terminal 100 of radio frequency module 1, radiates a radio frequency signal output from radio frequency module 1, and receives and outputs a radio frequency signal from the outside to radio frequency module 1.

Note that antenna 2 and BBIC 4 are not necessarily included in communication device 5 according to the present embodiment.

Next, a detailed configuration of radio frequency module 1 is to be described.

As illustrated in FIG. 1, radio frequency module 1 includes antenna connection terminal 100, power amplifier 10, low noise amplifier 20, transmission filters 30T and 40T, reception filters 30R and 40R, PA control circuit 80, matching circuits 61, 62, and 63, switches 51, 52, and 53, and diplexer 35.

Antenna connection terminal 100 is an example of an input/output terminal, and is an antenna common terminal connected to antenna 2.

Power amplifier 10 is a difference amplifying type amplifier circuit that amplifies radio frequency signals in communication band A and communication band B input through transmission input terminal 110.

PA control circuit 80 adjusts the gain of power amplifier 10 according to, for instance, a digital control signal input through control signal terminal 130. PA control circuit 80 may be formed as a semiconductor integrated circuit (IC). A semiconductor IC includes a complementary metal oxide semiconductor (CMOS), for example, and specifically, formed by a silicon on insulator (SOI) process. Accordingly, such a semiconductor IC can be manufactured at a low cost. Note that the semiconductor IC may include at least one of gallium arsenide (GaAs), silicon germanium (SiGe), or gallium nitride (GaN). Thus, a radio frequency signal having high amplification quality and high noise quality can be output.

Low noise amplifier 20 amplifies radio frequency signals in communication bands A and B while noise is kept low, and outputs the amplified radio frequency signals to reception output terminal 120.

Transmission filter 30T is disposed on transmission path AT that connects power amplifier 10 and antenna connection terminal 100, and passes a transmission signal in the transmission band of communication band A, within a transmission signal amplified by power amplifier 10. Transmission filter 40T is disposed on transmission path BT that connects power amplifier 10 and antenna connection terminal 100, and passes a transmission signal in the transmission band of communication band B, within a transmission signal amplified by power amplifier 10.

Reception filter 30R is disposed on reception path AR that connects low noise amplifier 20 and antenna connection terminal 100, and passes a reception signal in the reception band of communication band A, within a reception signal input through antenna connection terminal 100. Reception filter 40R is disposed on reception path BR that connects low noise amplifier 20 and antenna connection terminal 100, and passes a reception signal in the reception band of communication band B, within a reception signal input through antenna connection terminal 100.

Transmission filter 30T and reception filter 30R are included in duplexer 30 having a passband that is communication band A. Duplexer 30 transfers a transmission signal and a reception signal in communication band A by frequency division duplex (FDD). Transmission filter 40T and reception filter 40R are included in duplexer 40 having a passband that is communication band B. Duplexer 40 transfers a transmission signal and a reception signal in communication band B by FDD.

Note that duplexers 30 and 40 may each be a multiplexer that includes only a plurality of transmission filters, a multiplexer that includes only a plurality of reception filters, or a multiplexer that includes a plurality of duplexers. Transmission filter 30T and reception filter 30R may not be included in duplexer 30, and may be a single filter for signals transferred by time division duplex (TDD). In this case, one or more switches that switch between transmission and reception are disposed upstream, disposed downstream, or disposed upstream and downstream from transmission filter 30T and reception filter 30R.

Matching circuit 61 is disposed on a path that connects switch 53 and duplexer 30, and matches the impedance between (i) duplexer 30 and (ii) diplexer 35 and switch 53. Matching circuit 62 is disposed on a path that connects switch 53 and duplexer 40, and matches the impedance between (i) duplexer 40 and (ii) diplexer 35 and switch 53.

Matching circuit 63 is disposed on reception paths that connect low noise amplifier 20 and reception filters 30R and 40R, and matches the impedance between (i) low noise amplifier 20 and (ii) reception filters 30R and 40R.

Note that a matching circuit that matches the impedance between (i) power amplifier 10 and (ii) transmission filters 30T and 40T may be disposed on transmission paths that connect power amplifier 10 and transmission filters 30T and 40T.

Switch 51 includes a common terminal and two selection terminals. The common terminal of switch 51 is connected to the output terminal of power amplifier 10. One of the selection terminals of switch 51 is connected to transmission filter 30T, and the other selection terminal of switch 51 is connected to transmission filter 40T. This connection configuration allows switch 51 to switch connection of power amplifier 10 between transmission filter 30T and transmission filter 40T. Switch 51 includes a single pole double throw (SPDT) switch circuit, for example.

Switch 52 includes a common terminal and two selection terminals. The common terminal of switch 52 is connected to the input terminal of low noise amplifier 20 via matching circuit 63. One of the selection terminals of switch 52 is connected to reception filter 30R, and the other selection terminal of switch 52 is connected to reception filter 40R. This connection configuration allows switch 52 to switch between connection and disconnection of low noise amplifier to/from reception filter 30R and between connection and disconnection of low noise amplifier 20 to/from reception filter 40R. Switch 52 includes an SPDT switch circuit, for example.

Switch 53 is an example of an antenna switch and is connected to antenna connection terminal 100 via diplexer 35, and switches connection of antenna connection terminal 100 between (1) transmission path AT and reception path AR and (2) transmission path BT and reception path BR. Note that switch 53 includes a multiple connection switch circuit that allows simultaneous connections of (1) and (2) above.

Diplexer 35 is an example of a multiplexer, and includes filters 35L and 35H. Filter 35L has a passband that is a frequency range including communication bands A and B, and filter 35H has a passband that is a different frequency range other than the frequency range including communication bands A and B. One terminal of filter 35L and one terminal of filter 35H are connected in common to antenna connection terminal 100. Filters 35L and 35H are each an LC filter that includes at least one of a chip inductor or a chip capacitor, for example. Note that when the frequency range including communication bands A and B is lower than the above different frequency range, filter 35L may be a low pass filter, and filter 35H may be a high pass filter.

Note that transmission filters 30T and 40T and reception filters 30R and 40R described above may each be one of, for example, an acoustic wave filter that uses surface acoustic waves (SAWs), an acoustic wave filter that uses bulk acoustic waves (BAWs), an inductor-capacitor (LC) resonance filter, and a dielectric filter, and furthermore, are not limited to those filters.

Matching circuits 61 to 63 are not necessarily included in the radio frequency module according to the present disclosure.

In the configuration of radio frequency module 1, power amplifier 10, switch 51, transmission filter 30T, matching circuit 61, switch 53, and filter 35L are included in a first transmission circuit that transfers transmission signals in communication band A toward antenna connection terminal 100. Filter 35L, switch 53, matching circuit 61, reception filter 30R, switch 52, matching circuit 63, and low noise amplifier 20 are included in a first reception circuit that transfers reception signals in communication band A from antenna 2 through antenna connection terminal 100.

Power amplifier 10, switch 51, transmission filter 40T, matching circuit 62, switch 53, and filter 35L are included in a second transmission circuit that transfers transmission signals in communication band B toward antenna connection terminal 100. Filter 35L, switch 53, matching circuit 62, reception filter 40R, switch 52, matching circuit 63, and low noise amplifier 20 are included in a second reception circuit that transfers reception signals in communication band B from antenna 2 through antenna connection terminal 100.

According to the above circuit configuration, radio frequency module 1 can carry out at least one of transmission, reception, or transmission and reception of a radio frequency signal in communication band A or B. Furthermore, radio frequency module 1 can carry out at least one of simultaneous transmission, simultaneous reception, or simultaneous transmission and reception of radio frequency signals in communication bands A and B.

Note that in the radio frequency module according to the present disclosure, the two transmission circuits and the two reception circuits may not be connected to antenna connection terminal 100 via switch 53, and may be connected to antenna 2 via different terminals. It is sufficient if the radio frequency module according to the present disclosure includes at least one of the first transmission circuit or the second transmission circuit.

In the radio frequency module according to the present disclosure, it is sufficient if the first transmission circuit includes power amplifier 10 and at least one element out of transmission filter 30T, switches 51 and 53, and matching circuit 61. It is sufficient if the second transmission circuit includes power amplifier 10 and at least one element out of transmission filter 40T, switches 51 and 53, and matching circuit 62.

Low noise amplifier 20 and switches 51 to 53 may be formed in a single semiconductor IC. The semiconductor IC includes a CMOS, for example, and is specifically formed by the SOI process. Accordingly, such a semiconductor IC can be manufactured at a low cost. Note that the semiconductor IC may include at least one of GaAs, SiGe, or GaN. Thus, a radio frequency signal having high amplification quality and high noise quality can be output.

Figure 2A:
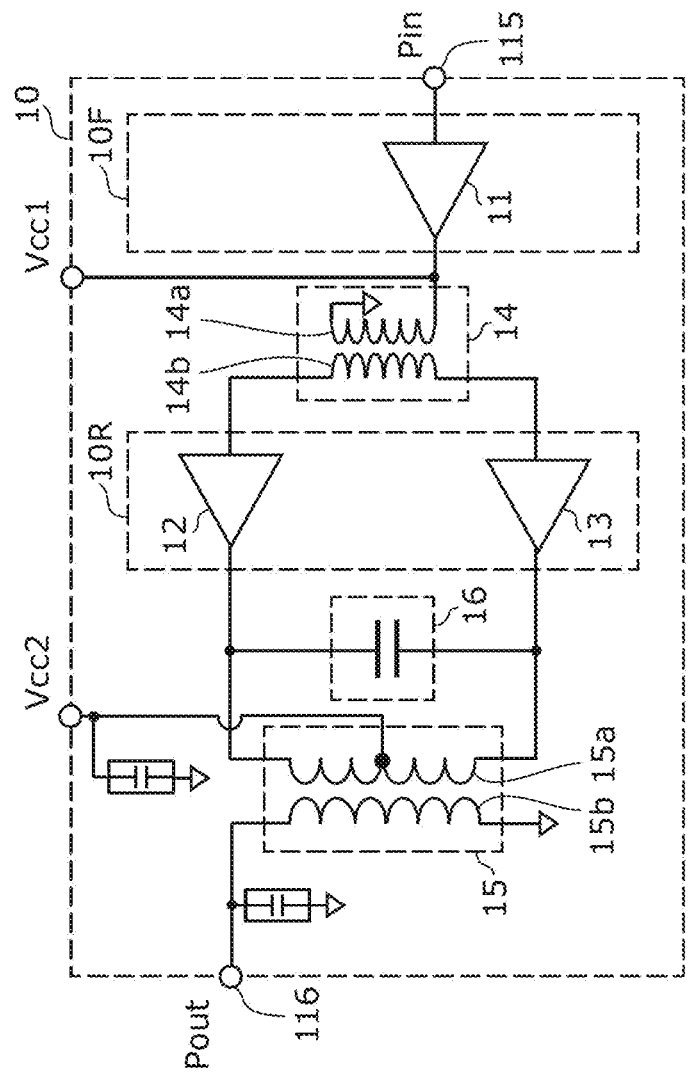
FIG. 2A illustrates a first example of a circuit configuration of a difference amplifying type power amplifier.

FIG. 2A illustrates a circuit configuration of a first example of the power amplifier according to the embodiment (power amplifier 10). As illustrated in FIG. 2A, power amplifier 10 includes input terminal 115, output terminal 116, amplifying element 12 (a first amplifying element), amplifying element 13 (a second amplifying element), amplifying element 11 (a third amplifying element), interstage transformer (transformer) 14, capacitor 16, and output transformer (unbalance-balance transforming element) 15.

Interstage transformer 14 is an example of a first transformer, and includes primary coil (first coil) 14a and secondary coil (second coil) 14b.

Amplifying element 11 is connected to interstage transformer 14, and is disposed between input terminal 115 and amplifying elements 12 and 13. More specifically, the input terminal of amplifying element 11 is connected to input terminal 115, and the output terminal of amplifying element 11 is connected to an end (an unbalance terminal) of primary coil 14a (the first coil) of interstage transformer 14. One end (a balance terminal) of secondary coil 14b (the second coil) of interstage transformer 14 is connected to the input terminal of amplifying element 12, and the other end (a balance terminal) of secondary coil 14b (the second coil) is connected to the input terminal of amplifying element 13. Thus, amplifying element 11 is disposed upstream from amplifying elements 12 and 13, is connected to interstage transformer 14, and is included in upstream amplifier circuit 10F.

A radio frequency signal input through input terminal 115 is amplified by amplifying element 11 in a state in which bias voltage Vcc1 is applied to amplifying element 11. Interstage transformer 14 applies unbalance-balance transform to the amplified radio frequency signal. At this time, a non-inverted input signal is output through the one end (the balance terminal) of secondary coil 14b, and an inverted input signal is output through the other end (the balance terminal) of secondary coil 14b.

Output transformer 15 is an example of a second transformer, and includes primary coil (third coil) 15a and secondary coil (fourth coil) 15b. The one end (the balance terminal) of primary coil 15a is connected to the output terminal of amplifying element 12, and the other end (the balance terminal) of primary coil 15a is connected to the output terminal of amplifying element 13. Bias voltage Vcc2 is supplied to a middle point of primary coil 15a. The one end (the unbalance terminal) of secondary coil 15b is connected to output terminal 116, and the other end of secondary coil 15b is connected to the ground. Stated differently, output transformer 15 is connected between (i) output terminal 116 and (ii) the output terminal of amplifying element 12 and the output terminal of amplifying element 13.

Capacitor 16 is connected between the output terminal of amplifying element 12 and the output terminal of amplifying element 13.

Impedance of a non-inverted input signal amplified by amplifying element 12 and impedance of an inverted input signal amplified by amplifying element 13 are transformed by output transformer 15 and capacitor 16 while the signals are maintained in antiphase with each other. Specifically, output transformer 15 and capacitor 16 match output impedance of power amplifier 10 at output terminal 116 to input impedance of switch 51 and transmission filters 30T and 40T illustrated in FIG. 1. Note that a capacitive element connected between the ground and a path that connects output terminal 116 and secondary coil 15b contributes to the impedance matching. Note that the capacitive element may be disposed in series on the path that connects output terminal 116 and secondary coil 15b, or may not be included.

Here, amplifying elements 12 and 13 are included in differential amplifier circuit 10R. In many cases, amplifying elements 12 and 13 are integrally formed by being formed in a single chip or being mounted on the same substrate, for instance. In contrast, output transformer 15 needs to have a high Q factor to handle a high-power transmission signal, and thus is not formed integrally with amplifying elements 12 and 13, for instance.

According to the circuit configuration of power amplifier 10, amplifying elements 12 and 13 operate in antiphase with each other. At this time, fundamental-wave currents flow through amplifying elements 12 and 13 in antiphase with each other, that is, in opposite directions, and thus fundamental-wave currents do not flow into a ground line or a power supply line disposed at a substantially equal distance from amplifying elements 12 and 13. Accordingly, inflow of unnecessary currents to the above lines can be disregarded, and thus decrease in power gain that is seen in a conventional power amplifier can be reduced. Further, a non-inverted signal and an inverted signal amplified by amplifying elements 12 and 13 are combined, and thus noise components superimposed similarly on the signals can be cancelled out, and unnecessary waves such as harmonic components, for example, can be decreased.

Note that amplifying element 11 is not necessarily included in power amplifier 10. An element that transforms an unbalanced input signal into a non-inverted input signal and an inverted input signal is not limited to interstage transformer 14. Capacitor 16 is not an essential element for impedance matching.

Amplifying elements 11 to 13 and low noise amplifier 20 each include a field effect transistor (FET) or a hetero-bipolar transistor (HBT) made of a silicon-based CMOS or GaAs, for example.

Note that upstream amplifier circuit 10F may be disposed downstream from interstage transformer 14.

Figure 2B:
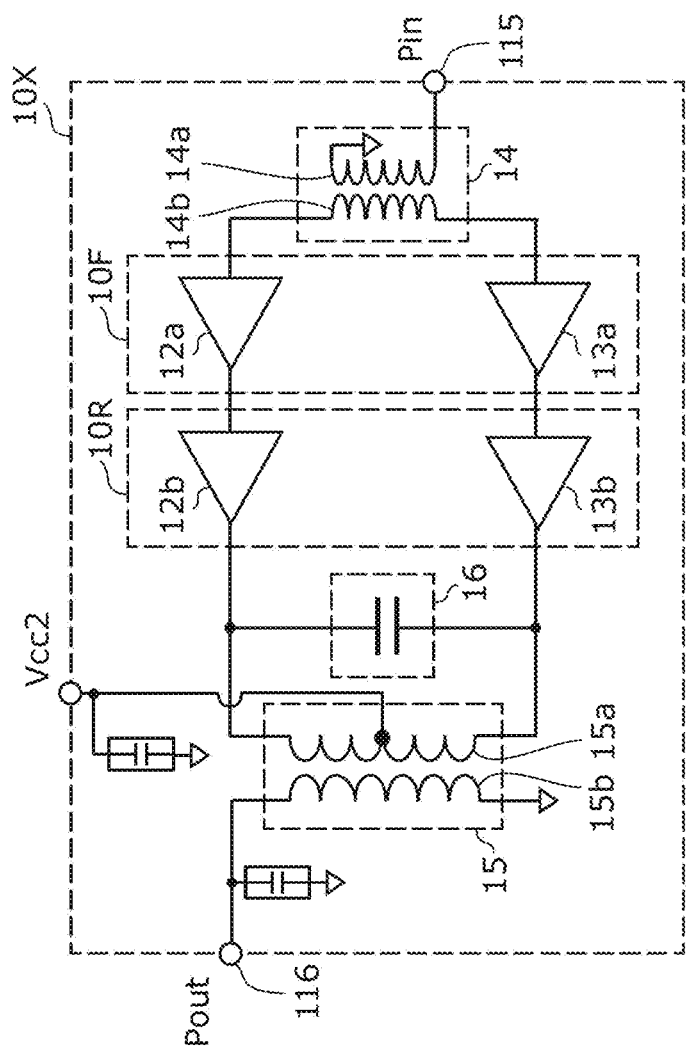
FIG. 2B illustrates a second example of a circuit configuration of the difference amplifying type power amplifier.

FIG. 2B illustrates a circuit configuration of a second example of the power amplifier according to the embodiment (power amplifier 10X). As illustrated in FIG. 2B, power amplifier 10X includes input terminal 115, output terminal 116, amplifying element 12b (a first amplifying element), amplifying element 13b (a second amplifying element), amplifying element 12a (a third amplifying element), amplifying element 13a (a third amplifying element), interstage transformer (transformer) 14, capacitor 16, and output transformer (unbalance-balance transforming element) 15.

Here, power amplifier 10X of the second example differs from power amplifier 10 of the first example, in the configuration and the location of upstream amplifier circuit 10F. The following description of the circuit configuration of power amplifier 10X of the second example focuses on differences from the circuit configuration of power amplifier 10 of the first example while a description of the same points is omitted.

Amplifying element 12a is connected to interstage transformer 14, and is disposed between input terminal 115 and amplifying element 12b. Amplifying element 13a is connected to interstage transformer 14, and is disposed between input terminal 115 and amplifying element 13b. More specifically, one end (a balance terminal) of secondary coil 14b (the second coil) of interstage transformer 14 is connected to the input terminal of amplifying element 12b via amplifying element 12a, and the other end (a balance terminal) of secondary coil 14b (the second coil) is connected to the input terminal of amplifying element 13b via amplifying element 13a. Thus, amplifying elements 12a and 13a are disposed upstream from amplifying elements 12b and 13b, are connected to interstage transformer 14, and are included in upstream amplifier circuit 10F.

Interstage transformer 14 applies unbalance-balance transform to a radio frequency signal input through input terminal 115, and a non-inverted input signal and an inverted input signal are output through the one end and the other end of secondary coil 14b, respectively. The non-inverted input signal output through the one end of secondary coil 14b is amplified by amplifying elements 12a and 12b. The inverted input signal output through the other end of secondary coil 14b is amplified by amplifying elements 13a and 13b.

Output transformer 15 is an example of the second transformer, and includes primary coil (third coil) 15a and secondary coil (fourth coil) 15b. One end (a balance terminal) of primary coil 15a is connected to the output terminal of amplifying element 12b, and the other end (a balance terminal) of primary coil 15a is connected to the output terminal of amplifying element 13b. Bias voltage Vcc2 is supplied to the middle point of primary coil 15a. One end (an unbalance terminal) of secondary coil 15b is connected to output terminal 116, and the other end of secondary coil 15b is connected to the ground. Stated differently, output transformer 15 is connected between (i) output terminal 116 and (ii) the output terminal of amplifying element 12b and the output terminal of amplifying element 13b.

Capacitor 16 is connected between the output terminal of amplifying element 12b and the output terminal of amplifying element 13b.

Impedance of a non-inverted input signal amplified by amplifying elements 12a and 12b and impedance of an inverted input signal amplified by amplifying elements 13a and 13b are transformed by output transformer 15 and capacitor 16 while the signals are maintained in antiphase with each other. Specifically, output transformer 15 and capacitor 16 match output impedance of power amplifier 10X at output terminal 116 to input impedance of switch 51 and transmission filters 30T and 40T illustrated in FIG. 1. Note that a capacitive element connected between the ground and a path that connects output terminal 116 and secondary coil 15b contributes to the impedance matching. Note that the capacitive element may be disposed in series on the path that connects output terminal 116 and secondary coil 15b, or may not be included.

Here, amplifying elements 12b and 13b are included in differential amplifier circuit 10R. In many cases, amplifying elements 12b and 13b are integrally formed by being formed in a single chip or being mounted on the same substrate, for instance. In contrast, output transformer 15 needs to have a high Q factor to handle a high-power transmission signal, and thus is not formed integrally with amplifying elements 12 and 13, for instance.

According to the circuit configuration of power amplifier 10X, amplifying elements 12b and 13b operate in antiphase with each other. At this time, fundamental-wave currents flow through amplifying elements 12b and 13b in antiphase with each other, that is, in opposite directions, and thus fundamental-wave currents do not flow into a ground line and a power supply line disposed at a substantially equal distance from amplifying elements 12b and 13b. Accordingly, inflow of unnecessary currents to the above lines can be disregarded, and thus decrease in power gain that is seen in a conventional power amplifier can be reduced. Further, a non-inverted signal and an inverted signal amplified by amplifying elements 12b and 13b are combined, and thus noise components superimposed similarly on the signals can be cancelled out, and unnecessary waves such as harmonic components, for example, can be decreased.

Here, when radio frequency module 1 is mounted on a single mounting board, many circuit elements (amplifying elements 11 to 13, interstage transformer 14, output transformer 15, and capacitor 16) are included in power amplifier 10 (or power amplifier 10X), which results in an increase in the size of radio frequency module 1. If the elements are mounted densely for size reduction, a high-power transmission signal output from power amplifier 10 (or power amplifier 10X) interferes with a circuit component included in radio frequency module 1, which leads to a problem that the signal quality of a radio frequency signal output from radio frequency module 1 deteriorates.

To address this, radio frequency module 1 according to the present embodiment has a configuration of miniaturizing radio frequency module 1 while reducing deterioration of the quality of a radio frequency signal output from radio frequency module 1. The following describes the configuration of radio frequency module 1 that reduces deterioration of the signal quality and also the size thereof.

[2. Arrangement of Circuit Elements of Radio Frequency Module 1A According to Example 1]

Figure 3B:
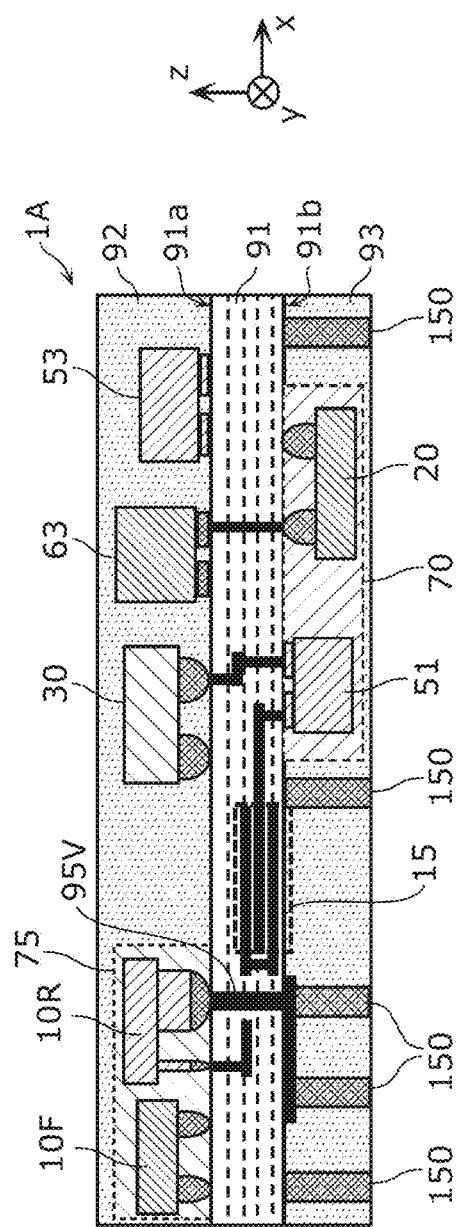
FIG. 3B is a schematic diagram illustrating a cross-sectional configuration of the radio frequency module according to Example 1.

FIG. 3A is a schematic diagram illustrating a planar configuration of radio frequency module 1A according to Example 1. FIG. 3B is a schematic diagram illustrating a cross-sectional configuration of radio frequency module 1A according to Example 1, and specifically, illustrates a cross section taken along line IIIB to IIIB in FIG. 3A. Note that (a) of FIG. 3A illustrates a layout of circuit elements when principal surface 91a out of principal surfaces 91a and 91b on opposite sides of module board 91 is viewed from the positive z-axis. On the other hand, (b) of FIG. 3A is a perspective view of a layout of circuit elements when principal surface 91b is viewed from the positive z-axis. FIG. 3A illustrates output transformer 15 disposed inside of module board 91 with dashed lines.

Radio frequency module 1A according to Example 1 shows a specific arrangement of circuit elements included in radio frequency module 1 according to the embodiment.

As illustrated in FIGS. 3A and 3B, radio frequency module 1A according to this example further includes module board 91, resin members 92 and 93, and external-connection terminals 150, in addition to the circuit configuration illustrated in FIG. 1.

Module board 91 is a board which includes principal surface 91a (a first principal surface) and principal surface 91b (a second principal surface) on opposite sides of module board 91, and on which the above transmission circuits and the above reception circuits are mounted. As module board 91, one of a low temperature co-fired ceramics (LTCC) board, a high temperature co-fired ceramics (HTCC) board, a component-embedded board, a board that includes a redistribution layer (RDL), and a printed circuit board, each having a stacked structure of a plurality of dielectric layers, is used, for example.

Resin member 92 is provided on principal surface 91a of module board 91, covers at least partially the transmission circuits, at least partially the reception circuits, and principal surface 91a of module board 91, and has a function of ensuring reliability of mechanical strength and moisture resistance, for instance, of the circuit elements included in the transmission circuits and the reception circuits. Resin member 93 is provided on principal surface 91b of module board 91, covers at least partially the transmission circuits, at least partially the reception circuits, and principal surface 91b of module board 91, and has a function of ensuring reliability of mechanical strength and moisture resistance, for instance, of the circuit elements included in the transmission circuits and the reception circuits. Note that resin members 92 and 93 are not necessarily included in the radio frequency module according to the present disclosure.

As illustrated in FIGS. 3A and 3B, in radio frequency module 1A according to this example, upstream amplifier circuit 10F, differential amplifier circuit 10R, interstage transformer 14, duplexers 30 and 40, matching circuits 61, 62, and 63, and switch 53 are disposed on principal surface 91a (a first principal surface) of module board 91. On the other hand, PA control circuit 80, low noise amplifier 20, switches 51 and 52, and diplexer 35 are disposed on principal surface 91b (a second principal surface) of module board 91. Output transformer 15 is disposed inside of module board 91.

Accordingly, in this example, differential amplifier circuit 10R (that includes amplifying elements 12 and 13) is mounted on principal surface 91a (the first principal surface). On the other hand, low noise amplifier 20 is a first circuit component, and is mounted on principal surface 91b (the second principal surface).

Note that duplexers 30 and 40, switch 53, and matching circuits 61, 62, and 63 are mounted on principal surface 91a (the first principal surface), but may be mounted on principal surface 91b (the second principal surface). Switches 51 and 52 and diplexer 35 are mounted on principal surface 91b (the second principal surface), but may be mounted on principal surface 91a (the first principal surface). The first circuit component mounted on principal surface 91b (the second principal surface) may not be low noise amplifier 20, and may be any of duplexers 30 and 40, matching circuits 61 to 63, PA control circuit 80, switches 51 to 53, and diplexer 35.

Power amplifier 10 includes at least amplifying elements 12 and 13, interstage transformer 14, and output transformer 15, and thus includes many components, which leads to an increase in a mounting area. Consequently, the size of the radio frequency module is likely to increase.

To address this, with the above configuration of radio frequency module 1A according to this example, amplifying elements 12 and 13 of power amplifier 10, and low noise amplifier 20 are separately disposed on the two sides of module board 91, and thus radio frequency module 1A can be miniaturized while ensuring isolation between transmission and reception. Low noise amplifier 20 that amplifies a reception signal can be prevented from being interfered with amplifying elements 12 and 13 that output high-power transmission signals, and thus deterioration of reception sensitivity can be reduced.

Note that desirably, module board 91 has a multilayer structure in which a plurality of dielectric layers are stacked, and a ground electrode pattern is formed on at least one of the dielectric layers. Accordingly, the electromagnetic field shielding function of module board 91 improves.

In radio frequency module 1A according to this example, upstream amplifier circuit 10F, differential amplifier circuit 10R, and interstage transformer 14 are included in single semiconductor IC 75, and semiconductor IC 75 is disposed on principal surface 91a (the first principal surface).

Accordingly, power amplifier 10 can be miniaturized, and thus radio frequency module 1A can be further miniaturized.

In radio frequency module 1A according to this example, external-connection terminals 150 are disposed on principal surface 91b of module board 91. Radio frequency module 1A exchanges electrical signals with a motherboard disposed on the negative z-axis side of radio frequency module 1A, via external-connection terminals 150. As illustrated in (b) of FIG. 3A, the external-connection terminals include antenna connection terminal 100, transmission input terminal 110, and reception output terminal 120. Potential of some of external-connection terminals 150 are set to the ground potential of the motherboard. On principal surface 91b facing the motherboard out of principal surfaces 91a and 91b, upstream amplifier circuit 10F and differential amplifier circuit 10R whose heights are not readily decreased are not disposed, and low noise amplifier 20 whose height is readily decreased is disposed, and thus the height of radio frequency module 1A as a whole can be decreased. Further, external-connection terminals 150 used as ground electrodes are disposed around low noise amplifier 20 that greatly affects reception sensitivity of the reception circuits, and thus deterioration of reception sensitivity of the reception circuits can be reduced.

Note that as illustrated in (b) of FIG. 3A, external-connection terminals 150 having the ground potential out of external-connection terminals 150 are desirably disposed between PA control circuit 80 and low noise amplifier 20, in a plan view of module board 91.

Accordingly, external-connection terminals 150 used as ground electrodes are disposed between low noise amplifier 20 and PA control circuit 80, and thus deterioration of reception sensitivity can be further reduced.

In this example, matching circuit 63 at least includes an inductor, and the inductor is disposed on principal surface 91a.

Accordingly, the inductor and PA control circuit 80 that greatly affect reception sensitivity of reception circuits are disposed with module board 91 being located therebetween, and thus a digital control line connected to PA control circuit 80 and the inductor can be prevented from being coupled via an electromagnetic field. Accordingly, deterioration of reception sensitivity caused by digital noise can be reduced.

Differential amplifier circuit 10R is a component that generates a great amount of heat, out of circuit components included in radio frequency module 1A. In order to improve heat dissipation of radio frequency module 1A, it is important to dissipate heat generated by differential amplifier circuit 10R to the motherboard through heat dissipation paths having low heat resistance. If differential amplifier circuit 10R is mounted on principal surface 91b, an electrode line connected to differential amplifier circuit 10R is disposed on principal surface 91b. Accordingly, the heat dissipation paths include a heat dissipation path along only a planar line pattern (in the xy plane direction) on principal surface 91b. The planar line pattern is formed of a thin metal film, and thus has high heat resistance. Accordingly, if differential amplifier circuit 10R is disposed on principal surface 91b, heat dissipation deteriorates.

To address this, radio frequency module 1A according to this example further includes heat-dissipating via conductor 95V that is connected to a ground electrode of differential amplifier circuit 10R on principal surface 91a, and extends from principal surface 91a to principal surface 91b, as illustrated in FIG. 3B. Heat-dissipating via conductor 95V is connected, on principal surface 91b, to external-connection terminals 150 having the ground potential out of external-connection terminals 150.

According to this configuration, when differential amplifier circuit 10R is mounted on principal surface 91a, differential amplifier circuit 10R and external-connection terminals 150 can be connected through heat-dissipating via conductor 95V. Accordingly, as heat dissipation paths for differential amplifier circuit 10R, a heat dissipation path extending along only a planar line pattern in the xy plane direction and having high heat resistance can be excluded from lines on and in module board 91. Thus, miniaturized radio frequency module 1A having improved heat dissipation from differential amplifier circuit 10R to the motherboard can be provided.

Note that low noise amplifier 20 and switches 51 and 52 may be included in single semiconductor IC 70. Accordingly, radio frequency module 1A can be miniaturized.

In radio frequency module 1A according to this example, output transformer 15 is formed inside of module board 91.

Here, as illustrated in FIGS. 3A and 3B, external-connection terminals 150 having the ground potential are disposed between output transformer 15 and low noise amplifier 20, in a plan view of module board 91.

Accordingly, output transformer 15 that transfers a high-power transmission signal, and low noise amplifier 20 that transfers a reception signal are isolated by external-connection terminals 150 having the ground potential, and thus isolation between transmission and reception can be increased.

Here, in a plan view of module board 91, desirably, no circuit component is disposed in regions in principal surface 91a and principal surface 91b that overlap a formation region in which output transformer 15 is formed, as illustrated in FIGS. 3A and 3B.

Output transformer 15 transfers a high-power transmission signal amplified by differential amplifier circuit 10R, and thus the Q factor of an inductor included in output transformer 15 is desirably high. If one or more circuit components are in a region that overlaps output transformer 15 in the above plan view, an electromagnetic field formed by the inductor is influenced by the one or more circuit components, and the Q factor of the inductor decreases, and power of a transmission signal output from output transformer 15 decreases. To address this, the above configuration can reduce a decrease in amplification performance of power amplifier 10.

Note that in this example, output transformer 15 is formed inside of module board 91, between principal surface 91a and principal surface 91b, and is offset toward principal surface 91b. In this case, in a plan view of module board 91, no circuit component is disposed in a region in principal surface 91b that overlaps the formation region in which output transformer 15 is formed, and one or more circuit components (not illustrated) may be disposed in a region in principal surface 91a that overlaps the formation region in which output transformer 15 is formed.

Even in this case, no circuit component is disposed in the above region in principal surface 91b closer to output transformer 15, and thus a decrease in the Q factor of the inductor of output transformer 15 can be reduced.

Figure 4A:
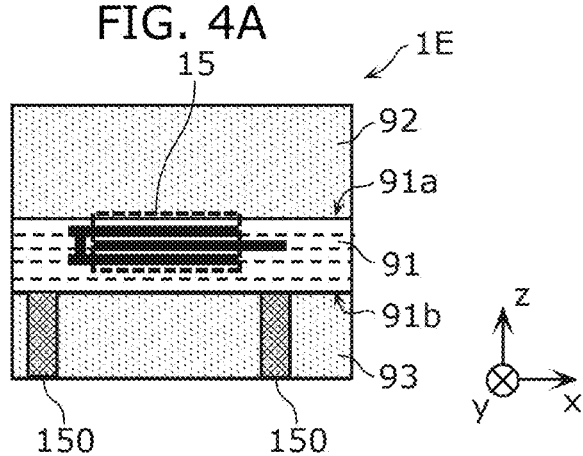
FIG. 4A is a schematic diagram illustrating a cross-sectional configuration of an output transformer according to Variation 1.

FIG. 4A is a schematic diagram of a cross-sectional configuration illustrating the position of output transformer 15 in radio frequency module 1E according to Variation 1. FIG. 4A illustrates the position of output transformer 15 in the cross-sectional configuration of radio frequency module 1E according to Variation 1. Note that the arrangement of circuit components included in radio frequency module 1E other than output transformer 15 is the same as that of radio frequency module 1A according to Example 1. In radio frequency module 1E, output transformer 15 is formed inside of module board 91, between principal surface 91a and principal surface 91b, and is offset toward principal surface 91a. In this case, in a plan view of module board 91, no circuit component is disposed in a region in principal surface 91a that overlaps the formation region in which output transformer 15 is formed, and one or more circuit components (not illustrated) may be disposed in a region in principal surface 91b that overlaps the formation region in which output transformer 15 is formed.

Even in this case, no circuit component is disposed in the above region in principal surface 91a that is closer to output transformer 15, and thus a decrease in the Q factor of the inductor of output transformer 15 can be reduced.

Figure 4B:
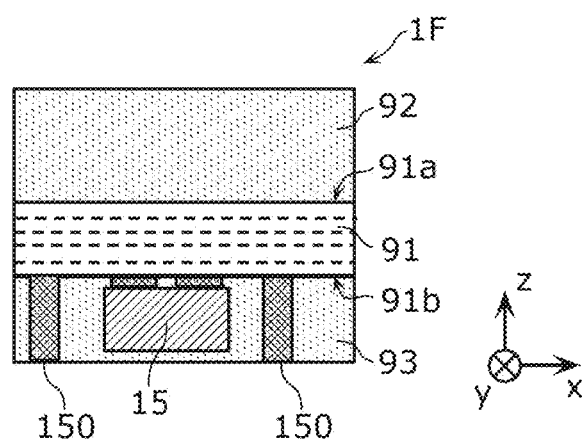
FIG. 4B is a schematic diagram illustrating a cross-sectional configuration of an output transformer according to Variation 2.

FIG. 4B is a schematic diagram of a cross-sectional configuration illustrating the position of output transformer 15 in radio frequency module 1F according to Variation 2. FIG. 4B illustrates the position of output transformer 15 in the cross-sectional configuration of radio frequency module 1F according to Variation 2. Note that the arrangement of circuit components included in radio frequency module 1F other than output transformer 15 is the same as radio frequency module 1A according to Example 1. In radio frequency module 1F, output transformer 15 is disposed on principal surface 91b. In this case, desirably, no circuit component is disposed in a region in principal surface 91a that overlaps the formation region in which output transformer 15 is formed, in a plan view of module board 91.

According to this configuration, no circuit component is disposed in the above region in principal surface 91a, and thus a decrease in the Q factor of the inductor of output transformer 15 can be reduced.

Figure 4C:
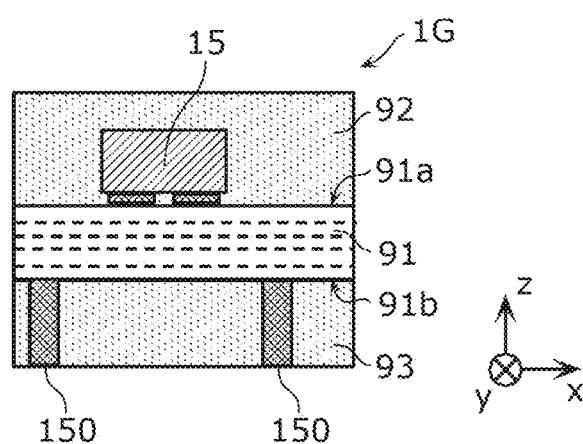
FIG. 4C is a schematic diagram illustrating a cross-sectional configuration of an output transformer according to Variation 3.

FIG. 4C is a schematic diagram of a cross-sectional configuration illustrating the position of output transformer 15 in radio frequency module 1G according to Variation 3. FIG. 4C illustrates the position of output transformer 15 in the cross-sectional configuration of radio frequency module 1G according to Variation 3. Note that the arrangement of circuit components included in radio frequency module 1G other than output transformer 15 is the same as radio frequency module 1A according to Example 1. In radio frequency module 1G, output transformer 15 is disposed on principal surface 91a. In this case, desirably, no circuit component is disposed in a region in principal surface 91b that overlaps the formation region in which output transformer 15 is formed, in a plan view of module board 91.

According to this configuration, no circuit component is disposed in the above region in principal surface 91b, and thus a decrease in the Q factor of the inductor of output transformer 15 can be reduced.

Furthermore, in each of radio frequency modules 1A, 1E, 1F, and 1G, desirably, a ground electrode pattern is not formed in a region that overlaps the formation region in which output transformer 15 is formed, in a plan view of module board 91. According to this configuration, it can be ensured that output transformer 15 and a ground electrode are widely spaced apart from each other, and the Q factor of the inductor included in output transformer 15 can be maintained high.

Note that the formation region in which output transformer 15 is formed is defined as follows. The formation region in which output transformer 15 is formed is a minimum region that includes a formation region in which the primary coil is formed and a formation region in which the secondary coil is formed, in a plan view of module board 91.

Here, secondary coil 15b is defined as a line conductor disposed along primary coil 15a, in a section in which a first distance from primary coil 15a is substantially constant. At this time, portions of the line conductor located on both sides of the above section are spaced apart from primary coil 15a by a second distance longer than the first distance, and one end and the other end of secondary coil 15b are points at which a distance from the line conductor to primary coil 15a changes from the first distance to the second distance. Primary coil 15a is defined as a line conductor disposed along secondary coil 15b, in a section in which the first distance from secondary coil 15b is substantially constant. At this time, portions of the line conductor located on both sides of the above section are spaced apart from secondary coil 15b by the second distance longer than the first distance, and one end and the other end of primary coil 15a are points at which a distance from the line conductor to secondary coil 15b changes from the first distance to the second distance.

Alternatively, secondary coil 15b is defined as a line conductor disposed along primary coil 15a, in a first section in which the line width is a substantially constant first width. Primary coil 15a is defined as a line conductor disposed along secondary coil 15b, in the first section in which the line width is the substantially constant first width.

Alternatively, secondary coil 15b is defined as a line conductor disposed along primary coil 15a, in a first section in which the thickness is a substantially constant first thickness. Primary coil 15a is defined as a line conductor disposed along secondary coil 15b, in the first section in which the thickness is the substantially constant first thickness.

Alternatively, secondary coil 15b is defined as a line conductor disposed along primary coil 15a, in a first section in which a degree of coupling with primary coil 15a is a substantially constant first degree of coupling. Further, primary coil 15a is defined as a line conductor disposed along secondary coil 15b, in the first section in which a degree of coupling with secondary coil 15b is the substantially constant first degree of coupling.

Figure 5:
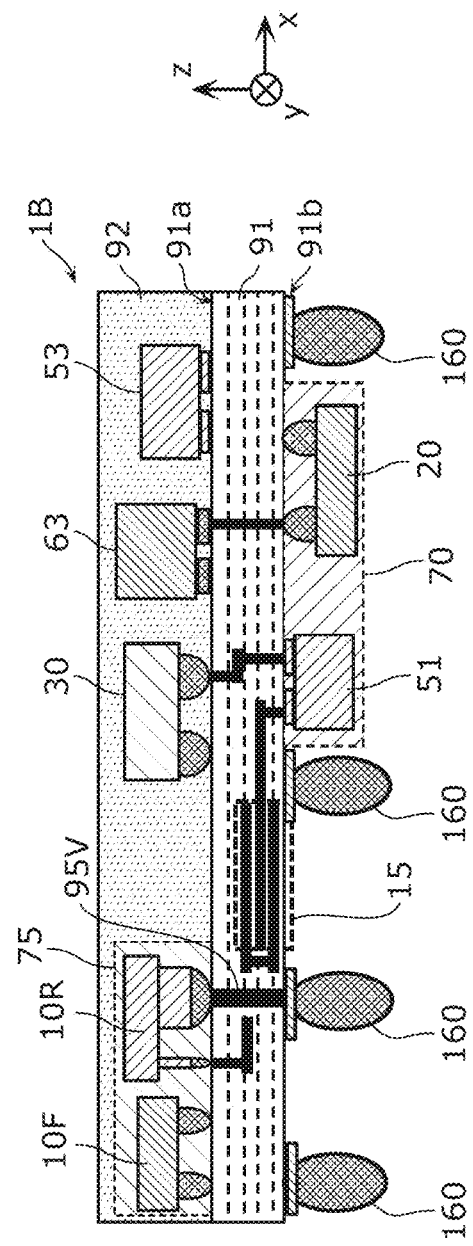
FIG. 5 is a schematic diagram illustrating a cross-sectional configuration of a radio frequency module according to Variation 4.

Note that external-connection terminals 150 may be columnar electrodes passing through resin member 93 in the z-axis direction as illustrated in FIGS. 3A and 3B, or may be bump electrodes 160 formed on principal surface 91b as in radio frequency module 1B according to Variation 4 illustrated in FIG. 5. In this case, resin member 93 may not be provided on principal surface 91b.

In radio frequency module 1A according to Example 1, external-connection terminals 150 may be disposed on principal surface 91a. In radio frequency module 1B according to Variation 4, bump electrodes 160 may be disposed on principal surface 91a.

[3. Arrangement of Circuit Elements of Radio Frequency Module 1C According to Example 2]

Figure 6B:
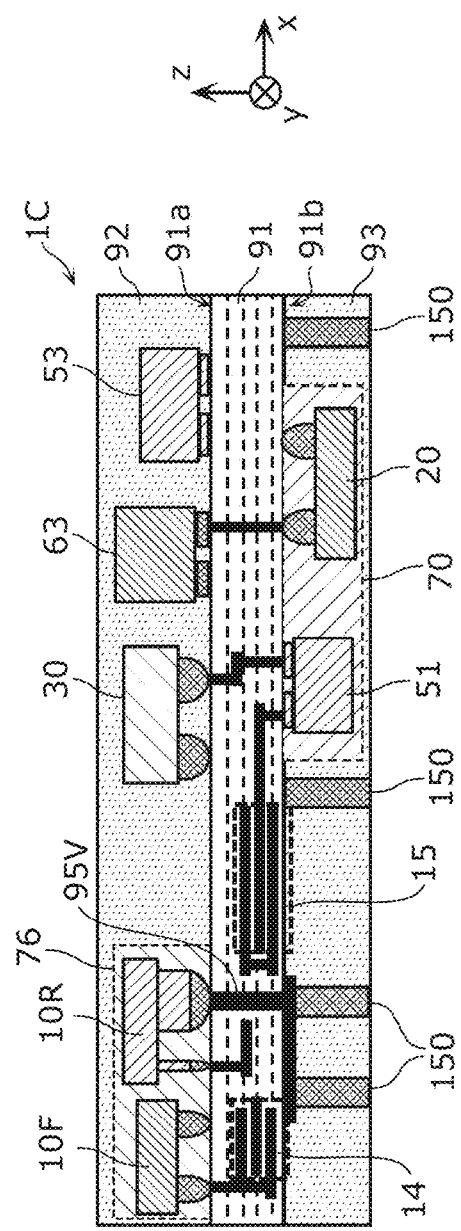
FIG. 6B is a schematic diagram illustrating a cross-sectional configuration of the radio frequency module according to Example 2.

FIG. 6A is a schematic diagram illustrating a planar configuration of radio frequency module 1C according to Example 2. FIG. 6B is a schematic diagram illustrating a cross-sectional configuration of radio frequency module 1C according to Example 2 and specifically, illustrates a cross section taken along line VIB to VIB in FIG. 6A. Note that (a) of FIG. 6A illustrates a layout of circuit elements when principal surface 91a out of principal surfaces 91a and 91b on opposite sides of module board 91 is viewed from the positive z-axis. On the other hand, (b) of FIG. 6A is a perspective view of a layout of circuit elements when principal surface 91b is viewed from the positive z-axis. FIG. 6A illustrates interstage transformer 14 and output transformer 15 formed inside of module board 91 with dashed lines.

Radio frequency module 1C according to Example 2 shows a specific arrangement of circuit elements included in radio frequency module 1 according to the embodiment.

Radio frequency module 1C according to this example is different from radio frequency module 1A according to Example 1, only in the arrangement of the circuit components included in radio frequency module 1C. The following description of radio frequency module 1C according to this example focuses on differences from radio frequency module 1A according to Example 1 while a description of the same points is omitted.

As illustrated in FIGS. 6A and 6B, in radio frequency module 1C according to this example, upstream amplifier circuit 10F, differential amplifier circuit 10R, duplexers 30 and 40, matching circuits 61, 62, and 63, and switch 53 are disposed on principal surface 91a (the first principal surface) of module board 91. On the other hand, PA control circuit 80, low noise amplifier 20, switches 51 and 52, and diplexer 35 are disposed on principal surface 91b (the second principal surface) of module board 91. Interstage transformer 14 and output transformer 15 are disposed inside of module board 91.

Thus, in this example, differential amplifier circuit 10R (that includes amplifying elements 12 and 13) is mounted on principal surface 91a (the first principal surface). On the other hand, low noise amplifier 20 is a first circuit component, and is mounted on principal surface 91b (the second principal surface). Interstage transformer 14 is disposed inside of module board 91.

Note that duplexers 30 and 40, switch 53, and matching circuits 61, 62, and 63 are mounted on principal surface 91a (the first principal surface), but may be mounted on principal surface 91b (the second principal surface). Switches 51 and 52 and diplexer 35 are mounted on principal surface 91b (the second principal surface), but may be mounted on principal surface 91a (the first principal surface). The first circuit component mounted on principal surface 91b (the second principal surface) may not be low noise amplifier 20, and may be any of duplexers 30 and 40, matching circuits 61 to 63, PA control circuit 80, switches 51 to 53, and diplexer 35.

Power amplifier 10 includes at least amplifying elements 12 and 13, interstage transformer 14, and output transformer 15, and thus includes many components, which leads to an increase in a mounting area. Consequently, the size of the radio frequency module is likely to increase.

To address this, according to the above configuration of radio frequency module 1C according to this example, amplifying elements 12 and 13 of power amplifier 10 and low noise amplifier 20 are separately disposed on the two sides of module board 91, and thus radio frequency module 1C can be miniaturized while ensuring isolation between transmission and reception. Low noise amplifier 20 that amplifies a reception signal can be prevented from being interfered with by amplifying elements 12 and 13 that output high-power transmission signals, and thus deterioration of reception sensitivity can be reduced.

In radio frequency module 1C according to this example, upstream amplifier circuit 10F and differential amplifier circuit 10R are included in single semiconductor IC 76, and semiconductor IC 76 is disposed on principal surface 91a (the first principal surface). Accordingly, power amplifier 10 can be miniaturized, and thus radio frequency module 1C can be further miniaturized.

As illustrated in FIGS. 6A and 6B, desirably, a footprint of upstream amplifier circuit 10F at least partially overlaps a footprint of interstage transformer 14 in a plan view of module board 91. According to this configuration, a line that connects amplifying element 11 and interstage transformer 14 can be shortened, and thus radio frequency module 1C can be miniaturized while reducing transfer loss of transmission signals.

In radio frequency module 1C according to this example, a plurality of external-connection terminals 150 are disposed on principal surface 91b of module board 91. As illustrated in FIG. 6B, radio frequency module 1C further includes heat-dissipating via conductor 95V that is connected, on principal surface 91a, to a ground electrode of differential amplifier circuit 10R, and extends from principal surface 91a to principal surface 91b. Heat-dissipating via conductor 95V is connected to external-connection terminals 150 (first external-connection terminals) having the ground potential out of external-connection terminals 150 on principal surface 91b.

According to this configuration, when differential amplifier circuit 10R is mounted on principal surface 91a, differential amplifier circuit 10R and external-connection terminals 150 can be connected through heat-dissipating via conductor 95V. Accordingly, as heat dissipation paths for differential amplifier circuit 10R, a heat dissipation path extending along only a planar line pattern in the xy plane direction and having high heat resistance can be excluded from lines on and in module board 91. Thus, miniaturized radio frequency module 1C having improved heat dissipation from differential amplifier circuit 10R to the motherboard can be provided.

As illustrated in FIG. 6B, in a plan view of module board 91, external-connection terminals 150 (the first external-connection terminals) connected to heat-dissipating via conductor 95V may be disposed between interstage transformer 14 and low noise amplifier 20.

Accordingly, interstage transformer 14 and low noise amplifier 20 are isolated by external-connection terminals 150 having the ground potential, and thus isolation between transmission and reception can be strengthened.

Note that external-connection terminals 150 may be disposed on principal surface 91a in radio frequency module 1C according to Example 2.

[4. Arrangement of Circuit Elements of Radio Frequency Module 1D According to Example 3]

Figure 7B:
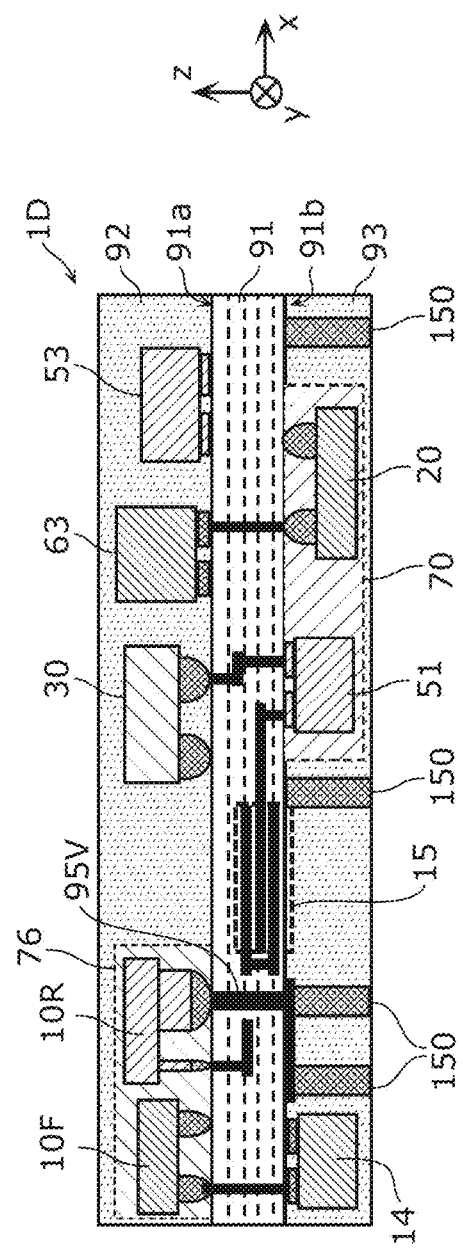
FIG. 7B is a schematic diagram illustrating a cross-sectional configuration of the radio frequency module according to Example 3.

FIG. 7A is a schematic diagram illustrating a planar configuration of radio frequency module 1D according to Example 3. FIG. 7B is a schematic diagram illustrating a cross-sectional configuration of radio frequency module 1D according to Example 3 and specifically, illustrates a cross section taken along line VII to VII in FIG. 7A. Note that (a) of FIG. 7A illustrates a layout of circuit elements when principal surface 91a out of principal surfaces 91a and 91b on opposite sides of module board 91 is viewed from the positive z-axis. On the other hand, (b) of FIG. 7A is a perspective view of a layout of circuit elements when principal surface 91b is viewed from the positive z-axis. FIG. 7A illustrates output transformer 15 formed inside of module board 91 with dashed lines.

Radio frequency module 1D according to Example 3 shows a specific arrangement of circuit elements included in radio frequency module 1 according to the embodiment.

Radio frequency module 1D according to this example is different from radio frequency module 1A according to Example 1, only in the arrangement of the circuit elements included in radio frequency module 1D. The following description of radio frequency module 1D according to this example focuses on differences from radio frequency module 1A according to Example 1 while a description of the same points is omitted.

As illustrated in FIGS. 7A and 7B, in radio frequency module 1D according to this example, upstream amplifier circuit 10F, differential amplifier circuit 10R, PA control circuit 80, duplexers 30 and 40, matching circuits 61, 62, and 63, and switch 53 are disposed on principal surface 91a (the first principal surface) of module board 91. On the other hand, interstage transformer 14, low noise amplifier 20, switches 51 and 52, and diplexer 35 are disposed on principal surface 91b (the second principal surface) of module board 91. Output transformer 15 is disposed inside of module board 91.

Thus, in this example, differential amplifier circuit 10R (that includes amplifying elements 12 and 13) is mounted on principal surface 91a (the first principal surface). On the other hand, low noise amplifier 20 is a first circuit component, and is mounted on principal surface 91b (the second principal surface). Interstage transformer 14 is mounted on principal surface 91b (the second principal surface).

Note that duplexers 30 and 40, switch 53, and matching circuits 61, 62, and 63 are mounted on principal surface 91a (the first principal surface), but may be mounted on principal surface 91b (the second principal surface). Switches 51 and 52 and diplexer 35 are mounted on principal surface 91b (the second principal surface), but may be mounted on principal surface 91a (the first principal surface). The first circuit component mounted on principal surface 91b (the second principal surface) may not be low noise amplifier 20, and may be any of duplexers 30 and 40, matching circuits 61 to 63, PA control circuit 80, switches 51 to 53, and diplexer 35.

Power amplifier 10 includes at least amplifying elements 12 and 13, interstage transformer 14, and output transformer 15 and thus includes many components, which leads to an increase in a mounting area. Consequently, the size of the radio frequency module is likely to increase.

To address this, according to the above configuration of radio frequency module 1D according to this example, amplifying elements 12 and 13 of power amplifier 10 and low noise amplifier 20 are separately disposed on the two sides of module board 91, and thus radio frequency module 1D can be miniaturized while ensuring isolation between transmission and reception. Low noise amplifier 20 that amplifies a reception signal can be prevented from being interfered with amplifying elements 12 and 13 that output high-power transmission signals, and thus deterioration of reception sensitivity can be reduced.

In radio frequency module 1D according to this example, upstream amplifier circuit 10F and differential amplifier circuit 10R are included in single semiconductor IC 76, and semiconductor IC 76 is disposed on principal surface 91a (the first principal surface). Accordingly, power amplifier 10 can be miniaturized, and thus radio frequency module 1D can be further miniaturized.

As illustrated in FIGS. 7A and 7B, desirably, a footprint of upstream amplifier circuit 10F at least partially overlaps a footprint of interstage transformer 14 in a plan view of module board 91. According to this configuration, a line that connects amplifying element 11 and interstage transformer 14 can be shortened, and thus radio frequency module 1D can be miniaturized while reducing transfer loss of a transmission signal.

In radio frequency module 1D according to this example, a plurality of external-connection terminals 150 are disposed on principal surface 91b of module board 91. As illustrated in FIG. 7B, radio frequency module 1D further includes heat-dissipating via conductor 95V that is connected, on principal surface 91a, to a ground electrode of differential amplifier circuit 10R, and extends from principal surface 91a to principal surface 91b. Heat-dissipating via conductor 95V is connected, on principal surface 91b, to external-connection terminals 150 (the first external-connection terminals) having the ground potential out of external-connection terminals 150.

Thus, miniaturized radio frequency module 1D having improved heat dissipation from differential amplifier circuit 10R to the motherboard can be provided.

As illustrated in FIG. 7B, in a plan view of module board 91, external-connection terminals 150 (the first external-connection terminals) connected to heat-dissipating via conductor 95V may be disposed between interstage transformer 14 and low noise amplifier 20.

Accordingly, interstage transformer 14 and low noise amplifier 20 are isolated by external-connection terminals 150 having the ground potential, and thus isolation between transmission and reception can be strengthened.

In this example, PA control circuit 80 may be disposed on principal surface 91a as illustrated in FIG. 7A. According to this configuration, PA control circuit 80 connected to the input side of power amplifier 10 and output transformer 15 connected to the output side of power amplifier 10 are not disposed on the same principal surface, and thus the occurrence of a feedback loop that causes an oscillation phenomenon between input and output of power amplifier 10 can be prevented, and thus power amplifier 10 can be stably operated.

Note that external-connection terminals 150 may be disposed on principal surface 91a, in radio frequency module 1D according to Example 3.

[5. Advantageous Effects]

As described above, radio frequency module 1 according to the present embodiment includes: module board 91 that includes principal surfaces 91a and 91b on opposite sides of module board 91; power amplifier 10 configured to amplify a transmission signal; and a first circuit component. Power amplifier 10 includes: amplifying element 12; amplifying element 13; interstage transformer 14 that includes primary coil 14a and secondary coil 14b; and output transformer 15 that includes primary coil 15a and secondary coil 15b, an end of secondary coil 14b is connected to an input terminal of amplifying element 12, another end of secondary coil 14b is connected to an input terminal of amplifying element 13, an end of primary coil 15a is connected to an output terminal of amplifying element 12, another end of primary coil 15a is connected to an output terminal of amplifying element 13, an end of secondary coil 15b is connected to an output terminal of power amplifier 10, amplifying element 12 and amplifying element 13 are disposed on principal surface 91a, and the first circuit component is disposed on principal surface 91b.

Accordingly, amplifying elements 12 and 13 of power amplifier 10 and the first circuit component are disposed on the two sides of the module board, and thus small radio frequency module 1 that includes difference amplifying type power amplifier 10 can be provided.

In radio frequency module 1, the first circuit component may be low noise amplifier 20 disposed on principal surface 91b.

According to this configuration, amplifying elements 12 and 13 of power amplifier 10 and low noise amplifier 20 are separately disposed on the two sides of module board 91, and thus radio frequency module 1 can be miniaturized, while ensuring isolation between transmission and reception. In addition, low noise amplifier 20 that amplifies a reception signal can be prevented from being interfered with amplifying elements 12 and 13 that output high-power transmission signals, and thus deterioration of reception sensitivity can be reduced.

In radio frequency module 1A, amplifying elements 12 and 13 and interstage transformer 14 may be included in single semiconductor IC 75, and single semiconductor IC 75 may be disposed on principal surface 91a.

Accordingly, power amplifier 10 can be miniaturized, and thus radio frequency module 1A can be further miniaturized.

In radio frequency module 1D, power amplifier 10 may further include amplifying element 11 disposed upstream from amplifying elements 12 and 13, amplifying element 11 being connected to interstage transformer 14, interstage transformer 14 may be disposed on principal surface 91b, and in a plan view of module board 91, a footprint of amplifying element 11 may at least partially overlap a footprint of interstage transformer 14.

According to this configuration, a line that connects amplifying element 11 and interstage transformer 14 can be shortened, and thus radio frequency module 1D can be miniaturized while reducing transfer loss of transmission signals.

In radio frequency module 1C, power amplifier 10 may further include amplifying element 11 disposed upstream from amplifying elements 12 and 13, amplifying element 11 being connected to interstage transformer 14, interstage transformer 14 may be disposed inside of module board 91, between principal surface 91a and principal surface 91b, and in a plan view of module board 91, a footprint of amplifying element 11 may at least partially overlap a footprint of interstage transformer 14.

According to this configuration, a line that connects amplifying element 11 and interstage transformer 14 can be shortened, and thus radio frequency module 1C can be miniaturized while reducing transfer loss of transmission signals.

Radio frequency module 1 may further include: a plurality of external-connection terminals 150 disposed on principal surface 91b; and heat-dissipating via conductor 95V connected to a ground electrode of amplifying element 12 and amplifying element 13, heat-dissipating via conductor 95V extending from principal surface 91a to principal surface 91b. Heat-dissipating via conductor 95V may be connected, on principal surface 91b, to a first external-connection terminal having a ground potential out of external-connection terminals 150.

According to this configuration, when differential amplifier circuit 10R is mounted on principal surface 91a, differential amplifier circuit 10R and one or more external-connection terminals 150 can be connected via heat-dissipating via conductor 95V. Accordingly, as heat dissipation paths for differential amplifier circuit 10R, a heat dissipation path extending along only a planar line pattern in the xy plane direction and having high heat resistance can be excluded from lines on and in module board 91. Thus, miniaturized radio frequency module 1 having improved heat dissipation from differential amplifier circuit 10R to the motherboard can be provided.

In radio frequency modules 1C and 1D, in the plan view of module board 91, the first external-connection terminal may be physically disposed between interstage transformer 14 and low noise amplifier 20.

Accordingly, interstage transformer 14 and low noise amplifier 20 are isolated by external-connection terminal 150 having the ground potential, and thus isolation between transmission and reception can be strengthened.

In radio frequency module 1G, desirably, output transformer 15 is disposed on principal surface 91a, and in a plan view of module board 91, no circuit component is disposed in a region included in principal surface 91b and overlapping output transformer 15.

According to this configuration, no circuit component is disposed in the above region in principal surface 91b, and thus a decrease in the Q factor of the inductor of output transformer 15 can be reduced.

In radio frequency module 1F, desirably, output transformer 15 is disposed on principal surface 91b, and in a plan view of module board 91, no circuit component is disposed in a region included in principal surface 91a and overlapping output transformer 15.

According to this configuration, no circuit component is disposed in the above region in principal surface 91a, and thus a decrease in the Q factor of the inductor of output transformer 15 can be reduced.

In radio frequency modules 1A and 1E, desirably, output transformer 15 is disposed inside of module board 91, between principal surface 91a and principal surface 91b, and in a plan view of module board 91, no circuit component is disposed in regions included in principal surface 91a and principal surface 91b and overlapping output transformer 15.

According to this configuration, no circuit component is disposed in the above regions in principal surfaces 91a and 91b, and thus a decrease in the Q factor of the inductor of output transformer 15 can be reduced.

In radio frequency modules 1A and 1E, output transformer 15 may be disposed inside of module board 91, between principal surface 91a and principal surface 91b, output transformer 15 being offset toward one of principal surface 91a and principal surface 91b, and in a plan view of module board 91, no circuit component is disposed in a region included in the one of principal surface 91a and principal surface 91b and overlapping output transformer 15, and a circuit component may be disposed in a region included in a remaining one of principal surface 91a and principal surface 91b and overlapping output transformer 15.

Even in this case, no circuit component is disposed in the above region in principal surface 91a closer to output transformer 15, and thus a decrease in the Q factor of the inductor of output transformer 15 can be reduced.

In radio frequency module 1, in the plan view of module board 91, external-connection terminal 150 having a ground potential may be physically disposed between output transformer 15 and low noise amplifier 20.

Accordingly, output transformer 15 that transfers a high-power transmission signal and low noise amplifier 20 that transfers a reception signal are isolated by external-connection terminal 150 having the ground potential, and thus isolation between transmission and reception is strengthened.

Radio frequency module 1D may further include PA control circuit 80 configured to control power amplifier 10, and PA control circuit 80 may be disposed on principal surface 91a.

According to this configuration, PA control circuit 80 connected to the input side of power amplifier 10 and output transformer 15 connected to the output side of power amplifier 10 are not disposed on the same principal surface so as to be separated from each other, and thus an oscillation phenomenon caused by a feedback loop between input and output of power amplifier 10 can be prevented, and thus power amplifier 10 can be stably operated.

Communication device 5 includes: antenna 2; RFIC 3 configured to process radio frequency signals transmitted and received by antenna 2; and radio frequency module 1 configured to transfer the radio frequency signals between antenna 2 and RFIC 3.

Accordingly, small communication device 5 that includes a difference amplifying type power amplifier can be provided.

Other Embodiments Etc

The above has described the radio frequency modules and the communication devices according to the embodiments of the present disclosure, based on embodiments, examples, and variations, yet the radio frequency module and the communication device according to the present disclosure are not limited to the above embodiments, examples, and variations. The present disclosure also encompasses another embodiment achieved by combining arbitrary elements in the embodiments, the examples, and the variations, variations as a result of applying various modifications that may be conceived by those skilled in the art to the embodiments, the examples, and the variations without departing from the scope of the present disclosure, and various apparatuses that include the radio frequency modules and the communication devices.

For example, in the radio frequency modules and the communication devices according to the embodiments, the examples, and the variations, another circuit element and another line, for instance, may be disposed between circuit elements and paths connecting signal paths, which are illustrated in the drawings.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure can be widely used in communication apparatuses such as mobile phones, as a radio frequency module disposed in a front-end portion that supports multiband technology.

The invention claimed is:

1. A radio frequency module, comprising:
a module board that includes a first principal surface and a second principal surface on opposite sides of the module board;
a low noise amplifier that is disposed on the second principal surface and configured to amplify a reception signal; and
a power amplifier configured to amplify a transmission signal, the power amplifier including
a first amplifying element disposed on the first principal surface;
a second amplifying element disposed on the first principal surface;
a first transformer that includes a first coil and a second coil; and
a second transformer that includes a third coil and a fourth coil, wherein
an end of the second coil is connected to an input terminal of the first amplifying element,
another end of the second coil is connected to an input terminal of the second amplifying element,
an end of the third coil is connected to an output terminal of the first amplifying element,
another end of the third coil is connected to an output terminal of the second amplifying element, and
an end of the fourth coil is connected to an output terminal of the power amplifier.

2. The radio frequency module of claim 1, wherein the first amplifying element, the second amplifying element, and the first transformer are included in a single semiconductor integrated circuit (IC), and
the single semiconductor IC is disposed on the first principal surface.

3. The radio frequency module of claim 1, wherein the power amplifier further includes a third amplifying element connected to the first transformer and disposed upstream on a signal path from the first amplifying element and the second amplifying element.

4. The radio frequency module of claim 3, wherein the first transformer is disposed on the second principal surface, and
in a plan view of the module board, a footprint of the third amplifying element at least partially overlaps a footprint of the first transformer.

5. The radio frequency module of claim 3, wherein the first transformer is disposed between the first principal surface and the second principal surface, and
in a plan view of the module board, a footprint of the third amplifying element at least partially overlaps a footprint of the first transformer.

6. The radio frequency module of claim 1, further comprising:
a plurality of external-connection terminals disposed on the second principal surface; and
a heat-dissipating via conductor that is connected to a ground electrode of the first amplifying element and the second amplifying element and extends from the first principal surface to the second principal surface.

7. The radio frequency module of claim 6, wherein the heat-dissipating via conductor is connected, on the second principal surface, to a first external-connection terminal having a ground potential out of the plurality of external-connection terminals.

8. The radio frequency module of claim 7, wherein in a plan view of the module board, the first external-connection terminal is disposed between the first transformer and the low noise amplifier.

9. The radio frequency module of claim 1, wherein the second transformer is disposed on the first principal surface.

10. The radio frequency module of claim 9, wherein in a plan view of the module board, no circuit component is disposed in a region of the second principal surface that overlaps the second transformer.

11. The radio frequency module of claim 9, wherein in a plan view of the module board, no circuit component is disposed in a region of the first principal surface that overlaps the second transformer.

12. The radio frequency module of claim 1, wherein the second transformer is disposed between the first principal surface and the second principal surface, and
in a plan view of the module board, no circuit component is disposed in regions of the first principal surface and the second principal surface that overlap the second transformer.

13. The radio frequency module of claim 1, wherein the second transformer is disposed between the first principal surface and the second principal surface and closer to one of the first principal surface and the second principal surface than another of the first principal surface and the second principal surface.

14. The radio frequency module of claim 13, wherein in a plan view of the module board, no circuit component is disposed in a region of the one of the first principal surface and the second principal surface that overlaps the second transformer.

15. The radio frequency module of claim 14, wherein in the plan view of the module board, a circuit component is disposed in a region of the another of the first principal surface and the second principal surface that overlaps the second transformer.

16. The radio frequency module of claim 1, wherein in the plan view of the module board, an external-connection terminal having a ground potential is disposed between the second transformer and the low noise amplifier.

17. The radio frequency module of claim 1, further comprising:
a control circuit disposed on the first principal surface and configured to control the power amplifier.

18. A communication device, comprising:
an antenna;
a radio frequency (RF) signal processing circuit configured to process radio frequency signals transmitted and received by the antenna; and a radio frequency module configured to transfer the radio frequency signals between the antenna and the RF signal processing circuit, the radio frequency module including
- a module board that includes a first principal surface and a second principal surface on opposite sides of the module board;
- a low noise amplifier that is disposed on the second principal surface and configured to amplify a reception signal; and
- a power amplifier including
  - a first amplifying element disposed on the first principal surface;
  - a second amplifying element; and
  - a transformer including a primary coil and a secondary coil, wherein
- a first end of the primary coil is connected to an output terminal of the first amplifying element,
- a second end of the primary coil is connected to an output terminal of the second amplifying element, and
- a first end of the secondary coil is connected to an output terminal of the power amplifier.

19. A radio frequency module, comprising:
- a module board that includes a first principal surface and a second principal surface on opposite sides of the module board;
- a low noise amplifier that is disposed on the second principal surface and configured to amplify a reception signal; and
- a power amplifier including
  - a first amplifying element disposed on the first principal surface;
  - a second amplifying element; and
  - a transformer including a primary coil and a secondary coil, wherein
- a first end of the primary coil is connected to an output terminal of the first amplifying element,
- a second end of the primary coil is connected to an output terminal of the second amplifying element, and
- a first end of the secondary coil is connected to an output terminal of the power amplifier.

\* \* \* \* \*